United States Patent [19]
Buti et al.

[11] Patent Number: 5,258,318
[45] Date of Patent: Nov. 2, 1993

[54] METHOD OF FORMING A BICMOS SOI WAFER HAVING THIN AND THICK SOI REGIONS OF SILICON

[75] Inventors: Taqi N. Buti, Millbrook; Louis L. Hsu; Mark E. Jost, both of Fishkill; Seiki Ogura, Hopewell Junction; Ronald N. Schulz, Salt Point, all of N.Y.

[73] Assignee: International Business Machines Corporation, Armonk, N.Y.

[21] Appl. No.: 884,510

[22] Filed: May 15, 1992

[51] Int. Cl.$^5$ .......................................... H01L 21/265
[52] U.S. Cl. ........................................ 437/34; 437/62; 437/90; 437/59; 437/51; 148/DIG. 9
[58] Field of Search .......... 437/62, 89, 90, 31, 437/34, 228, 59, 51; 148/DIG. 9

[56] References Cited

U.S. PATENT DOCUMENTS

| | | | |
|---|---|---|---|
| 3,647,581 | 3/1972 | Mash | 148/175 |
| 3,929,528 | 12/1975 | Davidson et al. | 148/175 |
| 4,177,094 | 12/1979 | Kroon | 148/175 |
| 4,507,158 | 3/1985 | Kamins et al. | 437/62 |
| 4,549,926 | 10/1985 | Corboy, Jr. et al. | 437/62 |
| 4,554,059 | 11/1985 | Short et al. | 204/129 |
| 4,615,762 | 10/1986 | Jastrzebski et al. | 437/62 |
| 4,760,036 | 7/1988 | Schubert | 437/62 |
| 4,897,362 | 1/1990 | Delgado et al. | 437/26 |
| 4,902,641 | 2/1990 | Koury, Jr. | 437/62 |
| 4,923,826 | 5/1990 | Jastrzebski et al. | 437/62 |
| 4,970,175 | 11/1990 | Haisma et al. | 437/90 |
| 4,971,925 | 11/1990 | Alexander et al. | 437/62 |
| 4,983,538 | 1/1991 | Gotou | 437/100 |
| 5,032,544 | 7/1991 | Ito et al. | 437/228 |
| 5,034,343 | 7/1991 | Rouse et al. | 437/86 |
| 5,036,021 | 7/1991 | Goto | 437/31 |
| 5,051,378 | 9/1991 | Yagi et al. | 437/225 |
| 5,081,061 | 1/1992 | Rouse et al. | 437/62 |
| 5,143,862 | 9/1992 | Moslehi | 437/62 |

FOREIGN PATENT DOCUMENTS

| | | | |
|---|---|---|---|
| 0144949 | 7/1985 | Japan | 437/62 |
| 63-21631 | 1/1988 | Japan | |
| 63-50791 | 3/1988 | Japan | |
| 0024719 | 2/1991 | Japan | 437/62 |

OTHER PUBLICATIONS

IEICE Transactions. vol. E 74. No. 2 Feb. 1991 "Electrical Properties and Technological Perspectives of Thin-Film SOI MOSFETs." Makoto Yshimi, et al.

IEDM Technical Digest, Dec. 1990, pp. 587-590, G. Shahidi, "Fabrication of CMOS on Ultrathin SOI Obtained by Epitaxial Lateral Overgrowth and Chemical-Mechanical Polishing."

Appl. Phys. Lett. 52(21), May 1988, pp. 1788-1790, M. Moniwa et al., "Influence of Si Film Thickness on Growth Enhancement in Si Lateral Solid Phase Epitaxy."

Primary Examiner—Brian E. Hearn
Assistant Examiner—Tuan Nguyen

[57] ABSTRACT

A SOI BiCMOS integrated circuit has CMOS devices formed in a thin epitaxial layer of 1,000 Å and bipolar devices formed in a thick epitaxial layer of 1 μm, the two thicknesses being formed by a process in which a set of oxide islands are formed on a first wafer; an epitaxial layer is grown from bipolar silicon regions up and over the islands in a step that forms the bottom portion of the bipolar regions; the first wafer is inverted and oxide-bonded to a second wafer with the newly grown epitaxial layer below the islands so that the new top surface has a high quality epitaxial layer; excess silicon is removed from the new surface and the surface is polished to a thickness of 1,000 Å over the islands by use of a nitride polish stop layer, leaving a thick layer of epitaxial silicon of 1 μm in the bipolar regions and a 1,000 Å thick layer of epitaxial silicon in the CMOS regions.

22 Claims, 4 Drawing Sheets

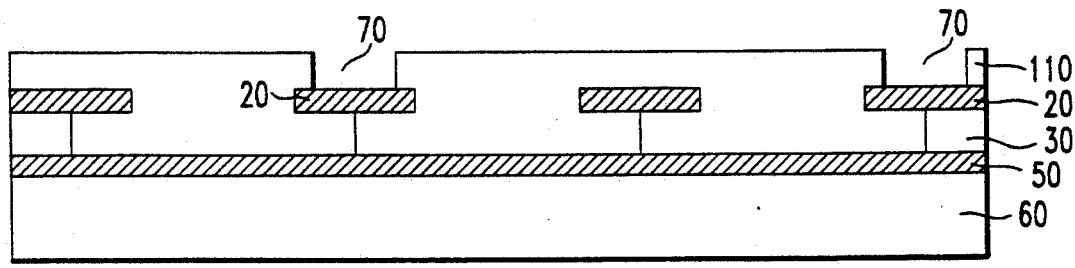
FIG. 6
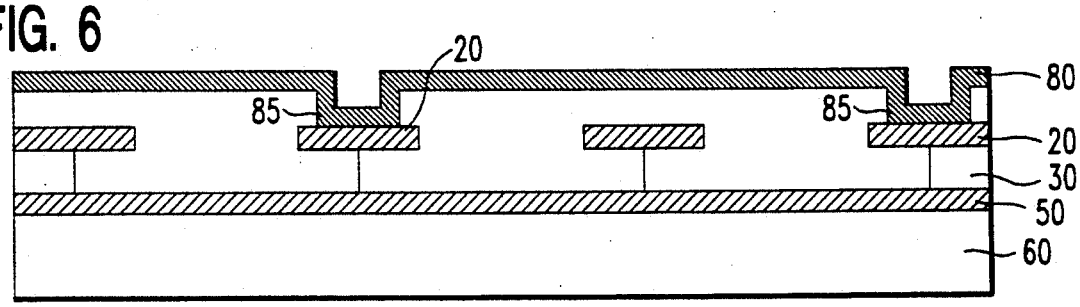
FIG. 7
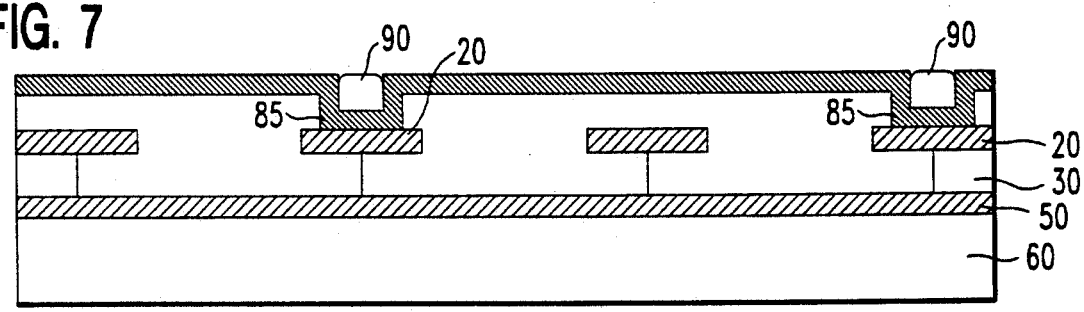
FIG. 8
FIG. 9
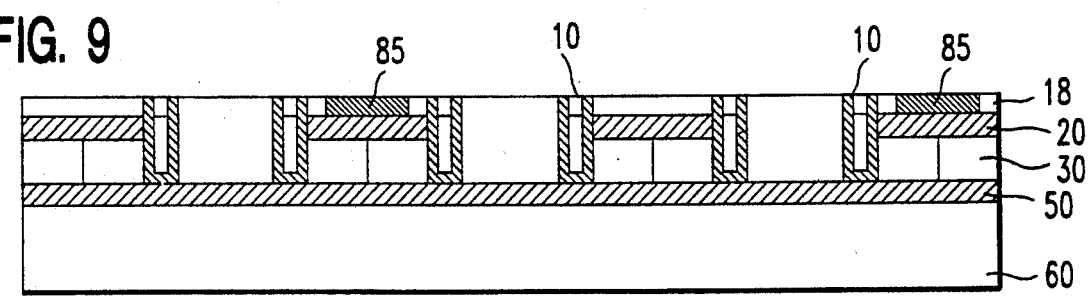
FIG. 10

METHOD OF FORMING A BICMOS SOI WAFER HAVING THIN AND THICK SOI REGIONS OF SILICON

TECHNICAL FIELD

The field of the invention is that of integrated circuit processing, in particular that of processing BiCMOS silicon-on-insulator (SOI) wafers that contain both thick silicon regions for the bipolar transistors and thin regions for the CMOS transistors.

BACKGROUND ART

It is well known that BiCMOS technology has the potential of combining the virtues of both of the two different types of transistors. Those skilled in the art have not been able to make optimal performance integrated circuits containing this combination because of the requirements for different processing. SOI device architectures allow the ultimate performance for both CMOS and bipolar transistors. However, it has been discovered (M. Yoshimi, et al "Electrical Properties and Technological Perspectives of Thin-Film SOI MOSFETS" IEICE trans, vol E74, no. Feb. 2, 1991, pp. 337-351) that superior SOI-CMOS scaling and performance can only be obtained if the silicon film thickness is 1,000 Å or less. On the other hand, high performance SOI bipolar transistors require a silicon film thickness of about 1 $\mu$m.

The art has not developed a method to accommodate the fact that CMOS circuits operate best in a shallow layer of silicon on oxide ($SiO_2$) while bipolar circuits operate best in a much thicker layer. Clearly, a process that provided for the differing SOI silicon thickness requirements of CMOS and bipolar would enable both devices to have optimum performance.

SUMMARY OF THE INVENTION

The invention relates to a method of BiCMOS processing in which silicon regions of two thicknesses are formed in an epitaxial (epi) device layer. A thin SOI region of less than 1,000 Å is used for the CMOS transistors and a thicker SOI region of about 1 $\mu$m for the bipolar transistors.

A feature of the invention is the use of epitaxial lateral overgrowth to form an epitaxial layer enclosing a set of buried oxide islands beneath the CMOS devices.

Another feature of the invention is the inversion of a first silicon wafer and bonding it to a second wafer so that the former top surface of the first wafer, having regions of lower material quality, is at the interface of the two wafers and a lower portion of the first wafer with higher material quality is used to form the devices.

Another feature of the invention is the use of a polish stop film to set the thickness of the thinner layer.

BRIEF DESCRIPTION OF DRAWINGS

FIGS. 1-10 illustrate in cross-section a portion of a wafer during different steps in the processing method.

BEST MODE OF CARRYING OUT THE INVENTION

Figure 1:
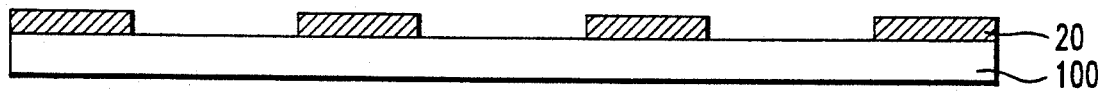

Referring now to FIG. 1, there is illustrated a p-type silicon substrate 100, having an initial thickness tolerance of 0.5% and having a patterned oxide layer 20 on top of it. This oxide layer, having a nominal thickness of 2,500 Å, has been grown by a conventional method such as oxidation in steam and patterned by etching using a conventional reactive ion etch (RIE) process or a wet etch in BHF to form oxide islands 20 that will be used to separate and insulate the thin layers that will be formed for the field effect transistors, (FETs, generically referred to as CMOS and including both P-channel and N-channel FETs). The area between islands 20 will be the sites of bipolar transistors.

Figure 2:
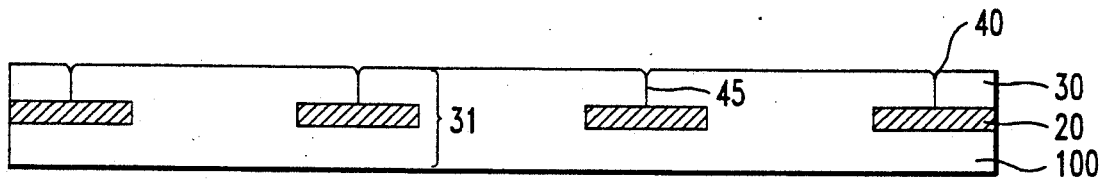

In FIG. 2, an epitaxial layer 30 of silicon, having a nominal thickness of 5 $\mu$m, has been grown enclosing the several oxide islands 20. This epitaxial layer 30 has been grown using the known technique of epitaxial lateral overgrowth as disclosed in G. Shahidi, et al "Fabrication of CMOS on Ultrathin SOI Obtained by Epitaxial Lateral Overgrowth and Chemical-Mechanical Polishing", IEDM technical digest, December, 1990 pp 587-590, in which the epitaxial layer starts from the areas between the oxide islands grows up and then grows laterally to meet above the oxide islands at an epitaxial join interface in the region denoted by the numeral 45. Alternatively, a solid phase epitaxy process, such as that illustrated in "Influence of Si Film Thickness on Growth Enhancement in Si Lateral Solid Phase Epitaxy", by M. Moniwa, et al in Appl. Phys. Lett. 52(21), May 1988, pp. 1,788-1,790, may be used.

In region 45, the crystal quality is not as high as it is in the rest of the epitaxial layer because there are dislocations and "twins" where the two pieces of silicon meet. It is an advantageous feature of the invention that this relatively low quality area is not used to form transistors. Also in FIG. 2, the epi surface (the first top surface) has been planarized by a conventional polishing step such as that illustrated in the Shahidi reference, which also eliminates any notch that may have formed in area 40 where the two sides of the epitaxial overgrowth meet.

In order to fill in the area over islands 20 with silicon, it is necessary to grow a considerably thicker layer of silicon than is needed and then to polish it down. Depending on a tradeoff between the cost of growing extra material and then polishing it away and possible adverse effects on the devices, it may be preferable to grow a thinner layer that will not fill the area over islands 20 and fill the gap with polycrystalline silicon (polysilicon or poly) that can be deposited quickly. Optionally, the polysilicon may be recrystallized in a high temperature anneal, in which the crystal structure in the epitaxial layer will transfer to the recrystallized material. Since the silicon surface in FIG. 2 must be grown above the top of islands 20 by some tolerance on the thickness denoted by the bracket 31 required to ensure that epi layer 30 will be thick enough after all the process steps. A final thickness of about 1.5 $\mu$m above the surface of islands 20 (as denoted by bracket 32 in FIG. 3) will provide a layer of epi above the islands that will be thick enough to hold the bottom portion of the bipolar transistors and all the poly deposited in the areas for the bipolar transistors will be removed, leaving poly only next to the islands 20.

Figure 3:
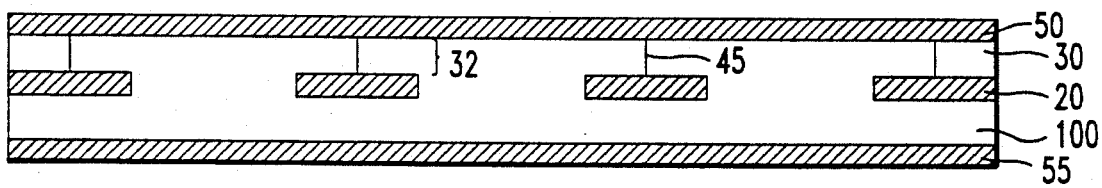

Next, in FIG. 3, both the top and the bottom layers of the wafer have been oxidized (about 3,000 Å) forming oxide layers 50 and 55 on both surfaces. The bracket denoted 32 extending to the base of oxide 50 represents the extra thickness of epi required to give the correct epi depth for the bipolar transistors. For convenience in claim writing, it will be referred to as the lower bipolar thickness, a corresponding upper bipolar thickness being the sum of the thickness of islands 20 and the thickness denoted by bracket 32 of the silicon film above the islands.

Figure 4:
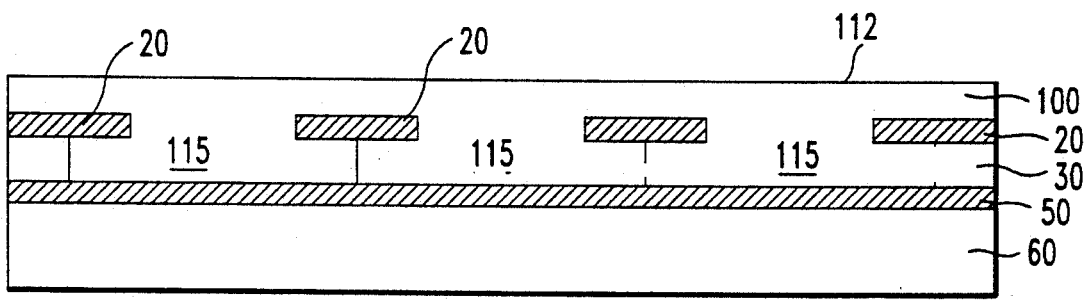

In FIG. 4, the first substrate 100 has been inverted and a second silicon substrate 60 has been bonded to the first substrate using oxide layer 50 as the bonding layer in a conventional process of heating the wafers in an oxygen ambient at 1,100° C. or less for several hours. Thus, the additional portion of epitaxial layer 30 that has been added is used only for the lower part of the bipolar transistors. After bonding, oxide 55 has been removed. It served to protect the underlying silicon from metallic or other contamination during the bonding step.

Figure 5:
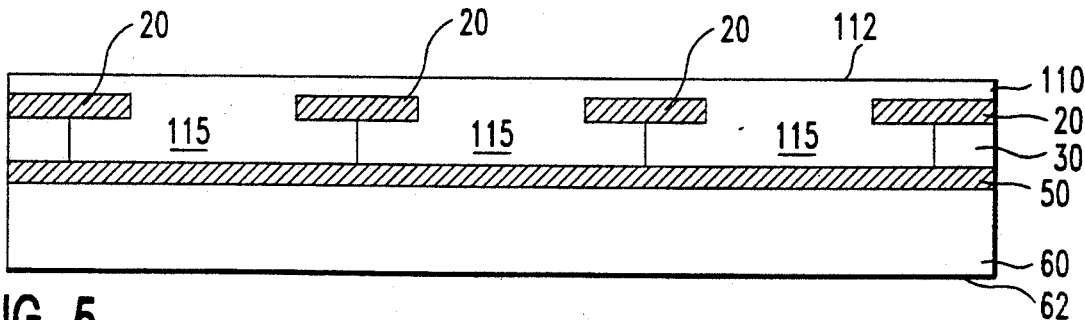

FIG. 5 shows the result after a silicon removal step in which layer 100 (the former substrate in FIG. 1) has been ground and/or etched and/or polished down to leave a thinner layer 110, of thickness about 2-3 μm, in areas 115 where the bipolar devices will be formed. The thickness of the silicon over islands 20 at this stage is a nominal 1 μm.

Figure 12:
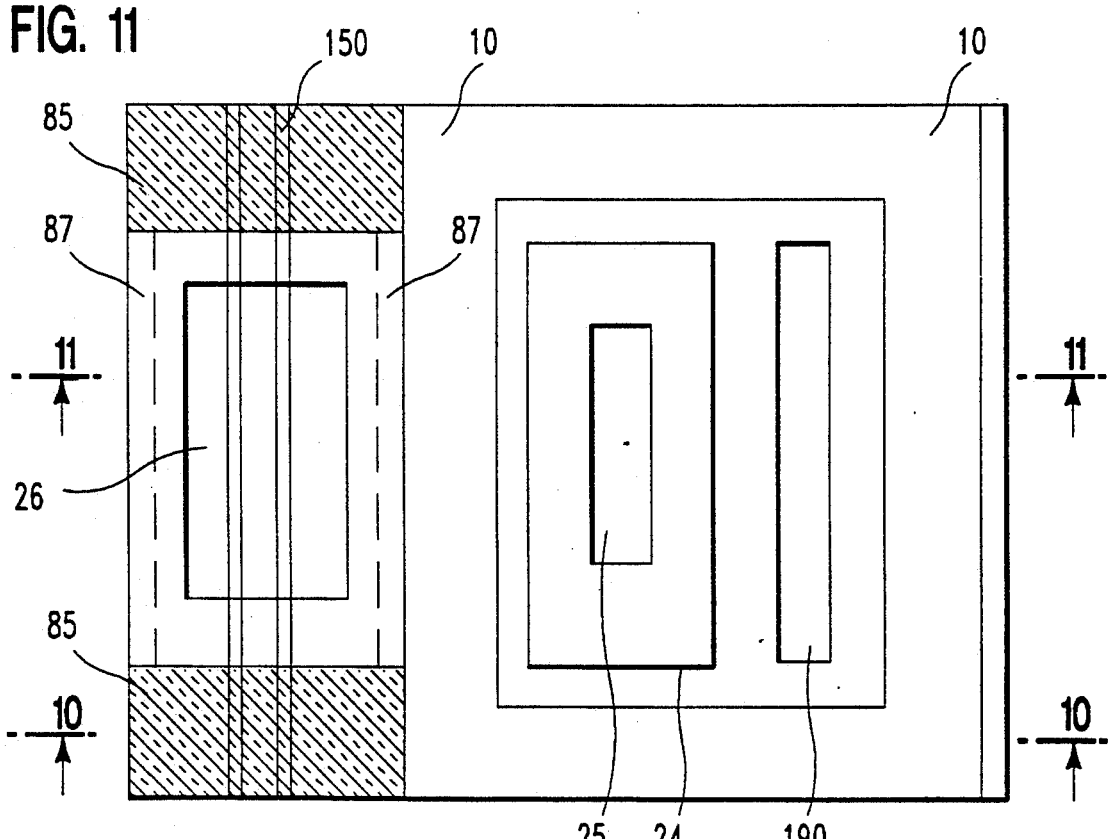
FIG. 12 illustrates in plan view the portion shown in FIGS. 1-10.

FIG. 6, a step of etching apertures 70 down to a polish stop subset of oxide islands 20, using the oxide as an etch stop in a highly selective silicon to oxide etch process, such as a $CrO_2$ acid wet etch or a $Cl_2/SF_6$ dry etch has been performed. Islands 20 extend perpendicular to the plane of the paper and the cross sections of FIGS. 1-10 are taken through line A—A in the plan view of FIG. 12. As can be seen in FIG. 12, line A—A has been taken through one edge of the islands 20, in order to show that rectangular aperture 70 occupies only a portion of the island, leaving room for a CMOS transistor in front of or behind the plane of the paper. Depending on the area of the polish stops 85 and the stiffness of the polishing pads, one or two polish stop pads may be used on an island. In the drawing, one of islands 20 has been shown without an aperture 70, in order to illustrate that an aperture 70' may be behind the plane of the paper (on the opposite edge from line A—A), or that if the islands are sufficiently close together, not all of them need to have polish stops.

A conformal (low pressure CVD) layer of nitride ($Si_3N_4$) 80 having a nominal thickness of 1,000 Å is deposited over the whole wafer as shown in FIG. 7.

Referring to FIGS. 8 and 9, a 1.5 μm layer of photoresist has been deposited and etched back in a conventional process using $O_2$ plasma to leave resist only inside aperture 70. The portion of nitride layer 80 not protected by photoresist 90, including the sidewalls will be stripped in a $CF_4$ reactive ion etch step. An optical emission end point plus a fixed amount of overetch to allow for tolerance in the etch process is used to insure that the nitride on the sidewalls is etched away, leaving a small aperture denoted by the numeral 95. Optionally, a wet step with hot phosphoric acid may be used. Then, the remaining resist 90 in FIG. 9 is removed, leaving nitride in apertures 70 to act as polish stops for the final polishing of silicon layer 110. In the last removal step, a conventional chemical-mechanical polishing step, such as that illustrated in U.S. Pat. No. 4,735,679, is performed in which the remainder of silicon layer 110 is thinned down until the top surface is coplanar with the nitride stops 85. The global planarity tolerance after this step is ±100 Å or better.

Figure 11:
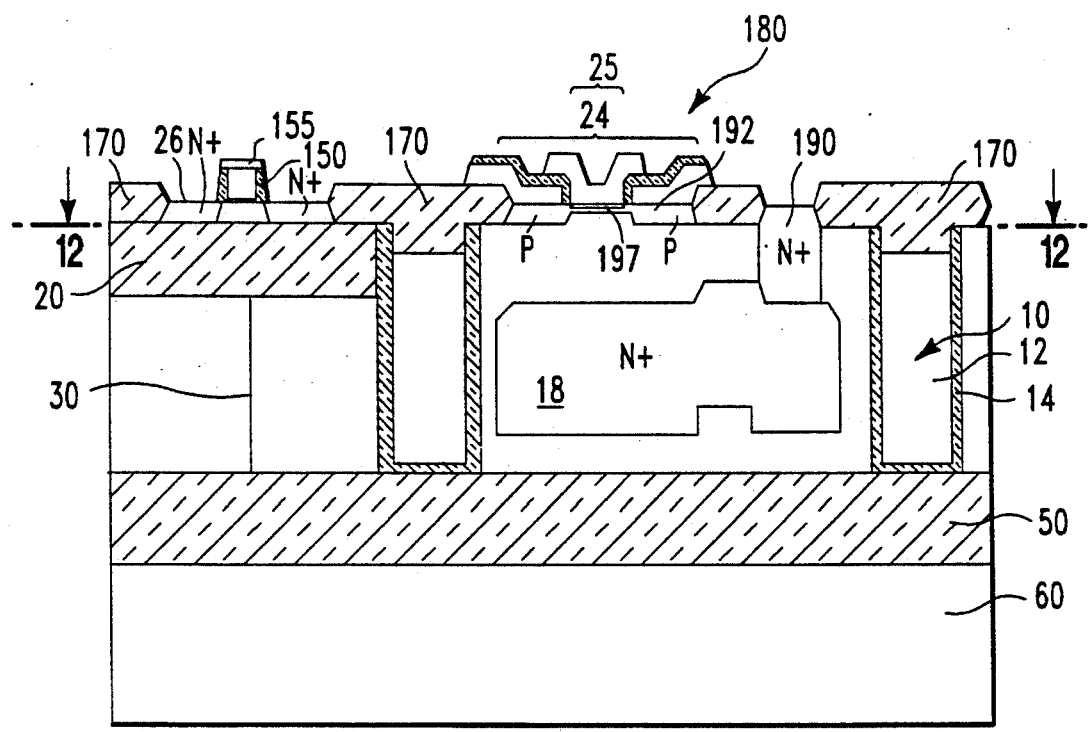
FIG. 11 illustrates in cross section a completed device of each type.

In FIG. 10, a set of deep trenches 10 have been cut by a reactive ion etch step (using $SF_6 + O_2$ plasma) down to oxide layer 50. These deep trenches surround and isolate the bipolar devices in regions 115, as can be seen in FIGS. 11 and 12. The remainder of the trench formation, including providing a sidewall liner of thermal oxide, filling the trench with polysilicon, and growing a cap of oxide is conventional and well known to those skilled in the art.

In the thin silicon layers above oxide 20, which may be formed into silicon mesas by shallow isolation trenches, the CMOS devices will be formed. In the thicker portions 115, the bipolar circuits will be formed. The deep trenches not only provide electrical isolation for the bipolar transistors, they also prevent crystal defects in regions 45 from propagating into the bipolar transistor regions. Preferably, the nitride plates 85 are removed in order to avoid excessive stress on the silicon layer covering the rest of the oxide island.

This technique therefore facilitates the coexistence of thin SOI regions for CMOS and thick SOI regions for bipolar in order to achieve optimal performance for BiCMOS circuits.

Referring now to FIGS. 11 and 12, a pair of complete transistors are shown. FIG. 11 is a cross section taken through line B—B of FIG. 12 and FIG. 12 is a plan view taken through line C—C in FIG. 11, showing the layout at the silicon surface. In FIG. 12, two polish stop pads 85 are shown, on either side of the island 20. An n-MOS transistor 150 having gate 155 and source/drain area 26 is shown on the left. On the right of FIG. 12, surrounded by deep trench 10, a conventional NPN bipolar transistor 180 has emitter 197, base 192 and vertical collector extension 190, connected to buried conductive layer 18. Layer 18 is doped using a high energy ion implantation step (Mitsubishi Electric Corp. "Implant and RTA in Japanese BiCMOS Process", Semiconductor International, June 1991 pp 27-28). A conventional field oxide 170 surrounds the transistors. If desired, a shallow trench 87 may be formed in the space left after removing nitride pads 85 and in a strip connecting pads 85. Alternatively, pads 85 might have the shape of a hollow rectangle surrounding the transistor site, so that removal of the polish stops and refill with oxide automatically forms the shallow trench isolation.

It is not necessary that bipolar and CMOS devices be positioned adjacent to one another as shown in the figures, which are drawn to illustrate the process, not any particular circuit layout, and there may be portions of circuits that have large numbers of bipolars without CMOS and vice versa. In FIG. 12, the layout of the polish stops is meant to be illustrative only. Those skilled in the art will readily be able to devise layouts suited to their purposes in order to achieve planarity and the required SOI thickness uniformity. For bipolar areas, the islands are simply omitted or small islands designed only to hold polish stops may be inserted in order to maintain the planarity of these regions. In the CMOS areas, large oxide pads may be grown that will hold a number of transistors. Thus, both the islands and the bipolar regions will have varying dimensions. Since large pads will not be filled in during the epitaxial lateral overgrowth step, the process alternative of filling in the exposed back side of the oxide layer 20 with a polysilicon layer will be used in order to maintain the planarity of bonding oxide 50 in FIG. 3.

Figure 13:
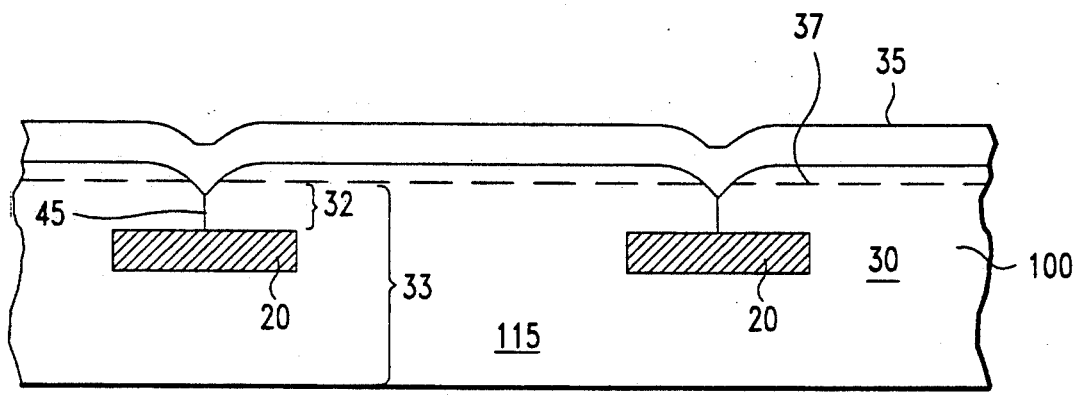
FIGS. 13 and 14 illustrate steps in an alternative embodiment of the invention.

Referring now to FIG. 13, there is shown a cross section of a wafer in an alternative step of FIG. 2. Epi layer 30 has been grown to a thickness greater than that indicated by the bracket labelled 33, which represents a bonding silicon surface 37 (after a planarization step) that will be the interface with bonding layer 50 in FIG. 4. The initial epi thickness is chosen to leave a thickness indicated by the bracket 32 that allows for the desired greater lower bipolar thickness of silicon in areas 115. Illustratively, distance 32 is 1.5 $\mu$m. A filler layer 35 of poly is deposited to fill in the notch above islands 20. When the top surface in FIG. 13 is polished to prepare for the bonding operation, there will be a small amount of poly above the islands. Preferably, the filler layer is recrystallized as described above in order to eliminate planarity problems from differential oxide growth on polysilicon and monocrystalline silicon.

Figure 14:
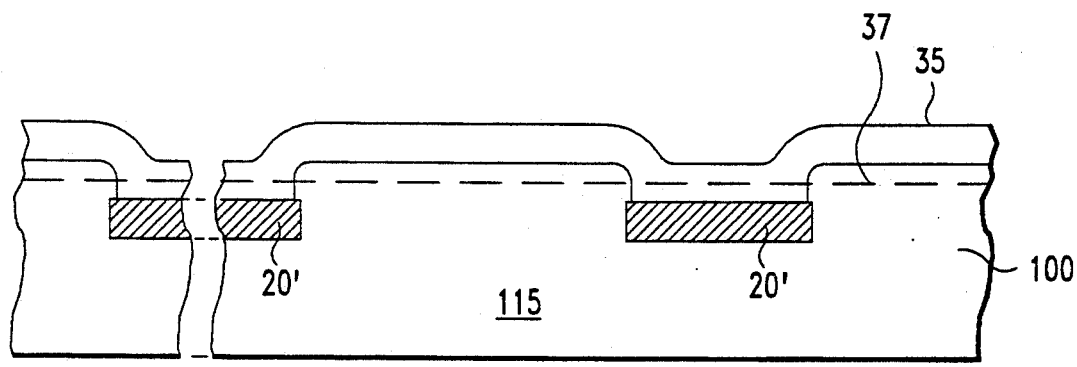

FIG. 14 illustrates another alternative, suitable for applications where there are many CMOS devices close together, so that it is not practical to attempt to have the sides of the epi overgrowth meet. For example, if a CMOS memory array of 100×100 transistors is required, it is obviously impractical to grow the epi so that it extends to meet in the center of an enormous island. In that case, the epi is grown only thick enough to provide the required distance 32, covering only the edges of island 20' and the filler layer of poly is deposited directly on the oxide and recrystallization is used as before.

Those skilled in the art will readily be able to devise alternative embodiments of the invention, such as the use of an oxide polish stop layer or a different method of depositing and patterning a nitride polish stop layer, and the following claims are not intended to be limited to the embodiment illustrated.

We claim:

1. A method of forming an SOI BiCMOS integrated circuit on a silicon wafer comprising the steps of:
    forming a first oxide layer of a thickness on a first side of a first silicon wafer;
    patterning said first oxide layer to form a set of oxide islands of a dimension;
    growing an epitaxial layer of silicon vertically from said silicon wafer and laterally over said set of oxide islands to a initial epitaxial thickness, whereby said epitaxial layer has a first top surface above said first side of said wafer and a set of join areas above said set of oxide islands where adjacent edges of said epitaxial layer converge laterally;
    forming a first bonding oxide layer on said first top surface;
    bonding said first silicon wafer to a second silicon wafer at said first bonding oxide layer on a bonding surface of said second silicon wafer, whereby a composite wafer is formed having a second top surface on a second side of said first wafer opposite said first bonding oxide layer and a bottom surface on a second side of said second silicon wafer opposite to said bonding surface;
    removing material from said second top surface of said composite wafer until said second top surface is within a polish distance of a closest surface of said set of oxide islands, whereby a device layer of silicon between said bonding oxide layer and said top surface extends past said set of oxide islands;
    etching said device layer above said set of oxide islands to expose an island top surface of a polish stop subset of said set of oxide islands;
    depositing a polish stop layer of a polish stop thickness on said polish stop subset of oxide islands;
    patterning said polish stop layer to form a set of polish stop gauges, having a gauge surface, on said polish stop subset of oxide islands;
    polishing said device layer until said second top surface of said device layer is coplanar with said gauge surface of said polish stop gauges, whereby said device layer has a first device layer thickness above said oxide islands and has a second device layer thickness greater than said first device layer thickness above said bonding oxide layer in bipolar regions of said device layer that are not above said set of oxide islands; forming a set of field effect transistors in said device layer above said islands;
    forming a set of bipolar transistors in said bipolar regions; and
    interconnecting said field effect transistors and bipolar transistors to form said integrated circuit.

2. A method according to claim 1, further including the step of planarizing said first top surface by a chemical-mechanical polishing step before forming said bonding oxide layer.

3. A method according to claim 2, in which said polish stop layer is formed from nitride.

4. A method according to claim 2, in which said polish stop layer is patterned by deposition and etch back of a layer of photoresist to leave protective photoresist pads above said polish stop gauges within said set of polish stop apertures, after which said polish stop layer is removed outside said protective photoresist pads.

5. A method according to claim 4, in which said polish stop layer is formed from oxide.

6. A method according to claim 1, further including the step of forming a set of deep trenches extending from said top surface of said device layer down to said bonding oxide layer and disposed to isolate bipolar transistors formed in said bipolar regions.

7. A method according to claim 6, in which said set of deep trenches include trench subsets that surround individual bipolar transistors.

8. A method according to claim 7, in which said polish stop layer if formed from nitride.

9. A method according to claim 7, in which said polish stop layer is patterned by deposition and etch back of a layer of photoresist to leave protective photoresist pads above said polish stop gauges within said set of polish stop apertures, after which said polish stop layer is removed outside said protective photoresist pads.

10. A method according to claim 9, in which said polish stop layer is formed from oxide.

11. A method according to claim 6, in which said polish stop layer is formed from nitride.

12. A method according to claim 6, in which said polish stop layer is patterned by deposition and etch back of a layer of photoresist to leave protective photoresist pads above said polish stop gauges within said set of polish stop apertures, after which said polish stop layer is removed outside said protective photoresist pads.

13. A method according to claim 12, in which said polish stop layer is formed from oxide.

14. A method according to claim 1, in which said polish stop layer is formed from nitride.

15. A method according to claim 1, in which said polish stop layer is patterned by deposition and etch back of a layer of photoresist to leave protective photoresist pads above said polish stop gauges within said set of polish stop apertures, after which said polish stop layer is removed outside said protective photoresist pads.

16. A method according to claim 15, in which said polish stop layer is formed from oxide.

17. A method according to any of claims 1-10, in which said step of growing an epitaxial layer of silicon to an initial epitaxial thickness is halted before said adjacent edges of said epitaxial layer have met;

further including a step of depositing a filler layer of polysilicon above said epitaxial layer, whereby said filler layer of polysilicon extends upwards from an island top surface for a polysilicon thickness; and a step of polishing said first top surface is performed after said step of depositing said filler layer of poly, thereby leaving a layer of polysilicon above said islands.

18. A method according to claim 17, in which said step of polishing said first top surface is halted to leave a layer of polysilicon over both said islands and said bipolar regions.

19. A method according to any of claims 1-10, in which said step of growing an epitaxial layer of silicon to an initial epitaxial thickness is halted after said adjacent edges of said epitaxial layer have met at an epitaxial join interface and before said epitaxial join interface has extended to greater than said polish distance;

further including a step or depositing a filler layer of polysilicon above said epitaxial layer, whereby said filler layer of polysilicon extends upwards in a notch region of said epitaxial above an island top surface for a polysilicon thickness; and a step of polishing said first top surface is performed after said step of depositing said filler layer of poly, thereby leaving a notch portion of polysilicon above said islands.

20. A method according to claim 19, in which said step of polishing said first top surface is halted to leave a layer of polysilicon over both said islands and said bipolar regions.

21. A method according to any of claims 1-10, in which said step of growing an epitaxial layer of silicon to an initial epitaxial thickness is halted before said adjacent edges of said epitaxial layer have met;

further including a step or depositing a filler layer of oxide above said epitaxial layer, whereby said filler layer of oxide extends upwards from an island top surface for a oxide thickness; and a step of polishing said first top surface is performed after said step of depositing said filler layer of oxide, thereby leaving a layer of oxide above said islands.

22. A method according to claim 21, in which said step of polishing said first top surface is halted to leave a layer of oxide over both said islands and said bipolar regions.

* * * * *